US012785353B2

(12) United States Patent
Li et al.

(10) Patent No.: US 12,785,353 B2
(45) Date of Patent: Nov. 3, 2026

(54) LASER DEVICE

(71) Applicant: Hisense Laser Display Co., Ltd, Qingdao City (CN)

(72) Inventors: Wei Li, Qingdao City (CN); Xiaoqiang Gu, Qingdao City (CN); Youliang Tian, Qingdao City (CN)

(73) Assignee: Hisense Laser Display Co., Ltd, Qingdao City (CN)

( * ) Notice: Subject to any disclaimer, the term of this patent is extended or adjusted under 35 U.S.C. 154(b) by 905 days.

(21) Appl. No.: 18/107,379

(22) Filed: Feb. 8, 2023

(65) Prior Publication Data

US 2023/0198219 A1 Jun. 22, 2023

Related U.S. Application Data

(63) Continuation of application No. PCT/CN2021/118077, filed on Sep. 13, 2021.

(30) Foreign Application Priority Data

Sep. 14, 2020 (CN) ......................... 202010961002.2

(51) Int. Cl.
*H01S 5/02253* (2021.01)
*G02B 27/30* (2006.01)
(Continued)

(52) U.S. Cl.
CPC .......... *H01S 5/02253* (2021.01); *G02B 27/30* (2013.01); *H01S 5/02315* (2021.01); (Continued)

(58) Field of Classification Search
CPC ............................ H01S 5/02253; G02B 27/30
See application file for complete search history.

(56) References Cited

U.S. PATENT DOCUMENTS

2008/0084905 A1* 4/2008 Doerfel .............. G02B 27/0961 372/43.01
2017/0170629 A1* 6/2017 Lerner ............... G02B 19/0052
(Continued)

FOREIGN PATENT DOCUMENTS

CN 1744395 A 3/2006
CN 102162932 A 8/2011
(Continued)

OTHER PUBLICATIONS

"Chinese Application No. 202010961002.2, Office Action dated Feb. 28, 2025", w English Translation, (Feb. 28, 2025), 15 pgs.
(Continued)

*Primary Examiner* — James A Menefee
(74) *Attorney, Agent, or Firm* — Schwegman Lundberg & Woessner, P.A.

(57) ABSTRACT

A laser device includes a base plate, a plurality of light-emitting chips, a frame and a collimating lens group. The plurality of light-emitting chips are configured to emit laser beams. The laser beams emitted by the plurality of light-emitting chips each have a first axis and a second axis. The collimating lens group is disposed on a side of the frame away from the base plate, and includes a plurality of collimating lenses. The plurality of collimating lenses correspond to the plurality of light-emitting chips. The collimating lens is configured to reduce a divergence angle of the laser beam incident on the collimating lens, so as to make a reduction of the divergence angle of the laser beam passing through the collimating lens in the first axis less than a reduction of the divergence angle of the laser beam passing through the collimating lens in the second axis.

14 Claims, 6 Drawing Sheets

(51) Int. Cl.

| | |
|---|---|
| ***H01S 5/02315*** | (2021.01) |
| ***H01S 5/0233*** | (2021.01) |
| ***H01S 5/40*** | (2006.01) |
| *H01S 5/02216* | (2021.01) |

(52) U.S. Cl.

CPC .......... *H01S 5/0233* (2021.01); *H01S 5/4087* (2013.01); *H01S 5/02216* (2013.01)

(56) References Cited

U.S. PATENT DOCUMENTS

| | | | | |
|---|---|---|---|---|
| 2017/0317467 | A1* | 11/2017 | Miura | H01S 5/4031 |
| 2019/0103723 | A1* | 4/2019 | Miura | H01S 5/0225 |
| 2019/0171018 | A1* | 6/2019 | Pierer | G02B 27/0172 |
| 2019/0391407 | A1* | 12/2019 | Sakai | G02B 3/06 |
| 2022/0077649 | A1* | 3/2022 | Takiguchi | H01S 5/02208 |

FOREIGN PATENT DOCUMENTS

| | | | | |
|---|---|---|---|---|
| CN | 109975985 | | 7/2019 | |
| CN | 209086575 | U | 7/2019 | |
| CN | 111562713 | A | 8/2020 | |
| CN | 112103764 | A | 12/2020 | |
| DE | 202006020283 | U1 * | 2/2008 | G02B 19/0052 |
| WO | 2020134220 | | 7/2020 | |

OTHER PUBLICATIONS

"International Application Serial No. PCT/CN2021/118077, International Search Report mailed Dec. 23, 2021", with English translation, 10 pgs.

"International Application Serial No. PCT/CN2021/118077, Written Opinion mailed Dec. 23, 2021", with English translation, 10 pgs.

"China Application Serial No. 202180062727.0, First Office Action mailed Apr. 18, 2026", With English Translation.

* cited by examiner

LASER DEVICE

CROSS-REFERENCE TO RELATED APPLICATIONS

This application is a continuation application of International Patent Application No. PCT/CN2021/118077, filed on Sep. 13, 2021, which claims priorities to Chinese Patent Application No. 202010961002.2, filed on Sep. 14, 2020, which are incorporated herein by reference in their entireties.

TECHNICAL FIELD

The present disclosure relates to the field of photoelectric technologies, and in particular, to a laser device.

BACKGROUND

With the development of photoelectric technologies, laser devices have been used widely. Among laser devices, multichip laser diode (MCL) devices are becoming more and more popular among consumers due to their advantages of high brightness, high power, long service life and small space occupation.

SUMMARY

A laser device is provided. The laser device includes a base plate, a plurality of light-emitting chips, a frame and a collimating lens group. The plurality of light-emitting chips are disposed on the base plate. The plurality of light-emitting chips are configured to emit laser beams. The laser beams emitted by the plurality of light-emitting chips each have a first axis and a second axis. The frame is disposed on the base plate and surrounds the plurality of light-emitting chips. The collimating lens group is disposed on a side of the frame away from the base plate. The collimating lens group includes a plurality of collimating lenses. The plurality of collimating lenses correspond to the plurality of light-emitting chips. At least one of the plurality of collimating lenses is configured to reduce a divergence angle of the laser beam incident on the collimating lens, so as to make a reduction of the divergence angle of a laser beam of the laser beams passing through the collimating lens in the first axis less than a reduction of the divergence angle of the laser beam passing through the collimating lens in the second axis.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
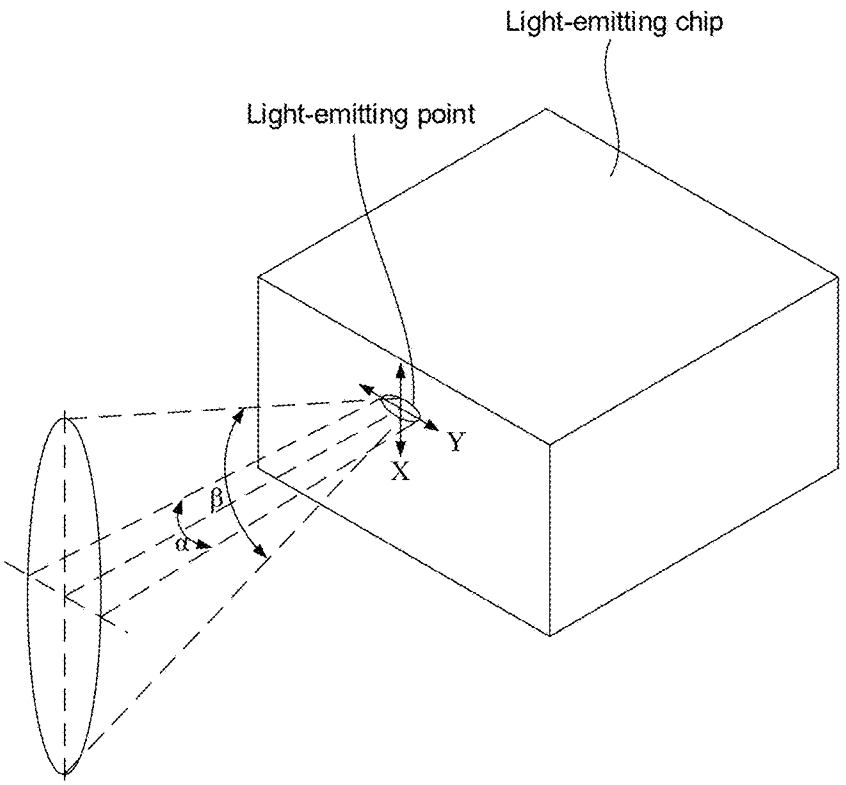
FIG. 1 is a schematic diagram showing a light-emitting chip emits a laser beam in the related art.

Some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term “comprise” and other forms thereof such as the third-person singular form “comprises” and the present participle form “comprising” are construed as an open and inclusive meaning, i.e., “including, but not limited to”. In the description of the specification, the terms such as “one embodiment”, “some embodiments”, “exemplary embodiments”, “example”, “specific example” or “some examples” are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as “first” and “second” are used for descriptive purposes only, and are not to be construed as indicating or implying the relative importance or implicitly indicating the number of indicated technical features. Thus, the features defined by “first” and “second” may explicitly or implicitly include one or more of the features. In the description of the embodiments of the present disclosure, the terms such as "a plurality of", "the plurality of" and "multiple" each mean two or more unless otherwise specified.

In the description of some embodiments, the term "connected" and derivatives thereof may be used. The term "connected" should be understood broadly. For example, the term "connected" may be a fixed connection, a detachable connection, or an integral connection; and it may be a direct connection or an indirect connection through an intermediate medium.

The phrase "A and/or B" includes following three combinations: only A, only B, and a combination of A and B.

The use of the phrase "applicable to" or "configured to" herein means an open and inclusive expression, which does not exclude devices applicable to or configured to perform additional tasks or steps.

The term such as "about", "substantially" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel", "perpendicular" or "equal" as used herein includes the stated conditions and the conditions similar to the stated conditions. A range of the similar conditions is within an acceptable deviation range, and the acceptable deviation range is determined by a person of ordinary skill in the art, considering measurement in question and the errors associated with the measurement of a particular quantity (i.e., the limitation of a measurement system).

FIG. 1 is a schematic diagram showing a light-emitting chip emits a laser beam in the related art.

Generally, a laser device includes a plurality of light-emitting chips, and each light-emitting chip may emit a laser beam. As shown in FIG. 1, the light-emitting chip has a light-emitting point from which the laser beam exits radially. A divergence angle $\beta$ of the laser beam emitted by the light-emitting chip in the fast axis X is greater than a divergence angle $\alpha$ of the laser beam in the slow axis Y. For example, for a light-emitting chip emitting a red laser beam, a divergence angle of the red laser beam in the fast axis X is about 68.2°, and a divergence angle of the red laser beam in the slow axis Y is about 8°. After being collimated by a collimating lens (e.g., a convex lens) in the laser device, the red laser beam emitted by the light-emitting chip has a much larger size in the fast axis X than in the slow axis Y.

In this case, the beam of the laser beam exiting from the laser device is thick. For example, the laser beam exiting from the laser device forms an elliptical beam spot on a plane perpendicular to a laser-exit direction of the laser device, and a major axis of the beam spot is much greater than a minor axis of the beam spot. Thus, in an optical path assembly where the laser device is applied, sizes of some optical elements are required to be large to satisfy the propagation of the laser beam emitted by the laser device, which is not conducive to the miniaturization of the optical path assembly.

It will be noted that, the collimation of the laser beam means converging the laser beam, so as to reduce the divergence angle of the laser beam and make the laser beam approximately parallel. The fast axis X is perpendicular to the slow axis Y, and the fast axis X and the slow axis Y each are perpendicular to the propagation direction of the laser beam. For example, the propagation direction of the laser beam is perpendicular to a plane defined by the fast axis X and the slow axis Y.

In addition, a collimating effect of the collimating lens in the laser device on the laser beam may affect an energy of the laser beam exiting from the laser device. For example, the better the collimating effect of the collimating lens in the laser device on the laser beam, the stronger the energy and the higher the brightness of the laser beam emitted by the laser device, so that a display effect of a display image is improved.

In order to improve the collimating effect of the laser device on the laser beam, some embodiments of the present disclosure provide a laser device 10.

Figure 2:
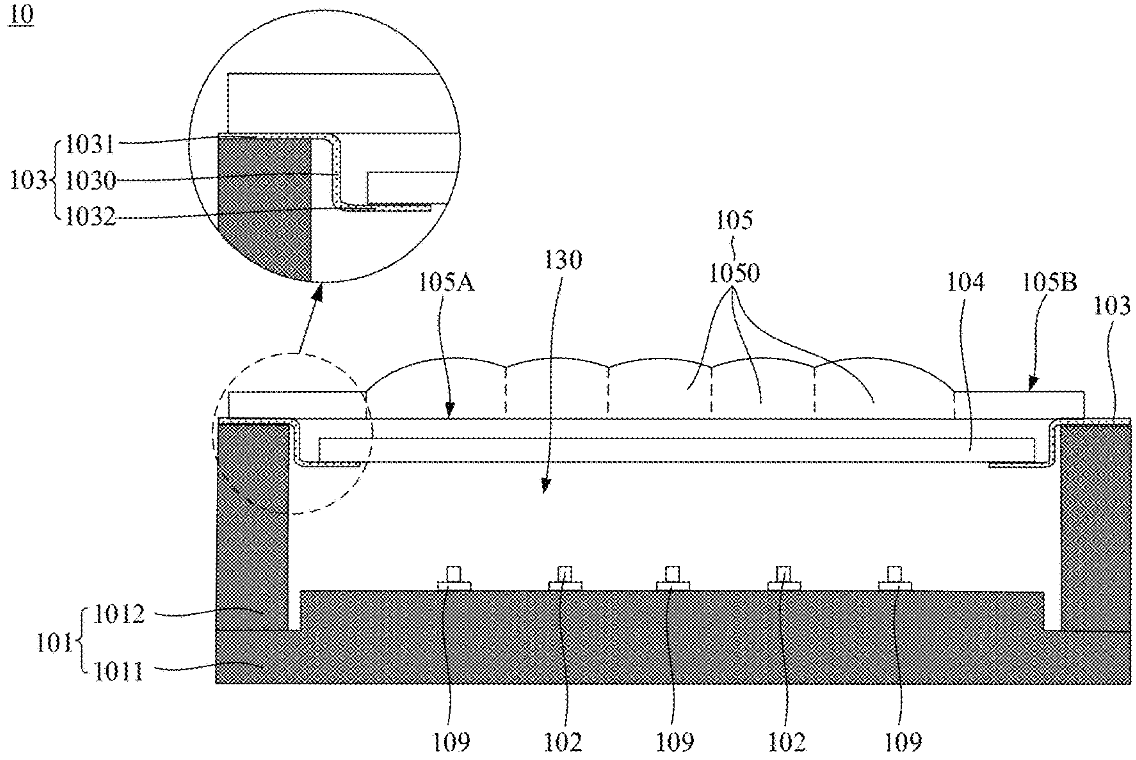
FIG. 2 is a diagram showing a structure of a laser device, in accordance with some embodiments.

FIG. 2 is a diagram showing a structure of a laser device, in accordance with some embodiments. The laser device 10 is a multi-chip laser diode (MCL) device. As shown in FIG. 2, the laser device 10 includes a base plate 1011, a frame 1012, a plurality of light-emitting chips 102, a cover plate 103, a light-transmitting layer 104, and a collimating lens group 105.

The plurality of light-emitting chips 102 are disposed on the base plate 1011 and configured to emit laser beams. The frame 1012 is disposed on the base plate 1011 and surrounds the plurality of light-emitting chips 102. The cover plate 103, the light-transmitting layer 104 and the collimating lens group 105 each are located on a side of the light-emitting chips 102 away from the base plate 1011. The laser beams emitted by the plurality of light-emitting chips 102 may be incident on the light-transmitting layer 104 and exit from the laser device 10 after passing through the light-transmitting layer 104 and the collimating lens group 105.

In some embodiments, the frame 1012 may have an annular shape (e.g., a square ring shape) and be mounted on the base plate 1011. Moreover, the frame 1012 may be disposed perpendicular to the base plate 1011. Of course, the frame 1012 may have a circular ring shape, a pentagonal ring shape, or other ring shape.

Figure 3:
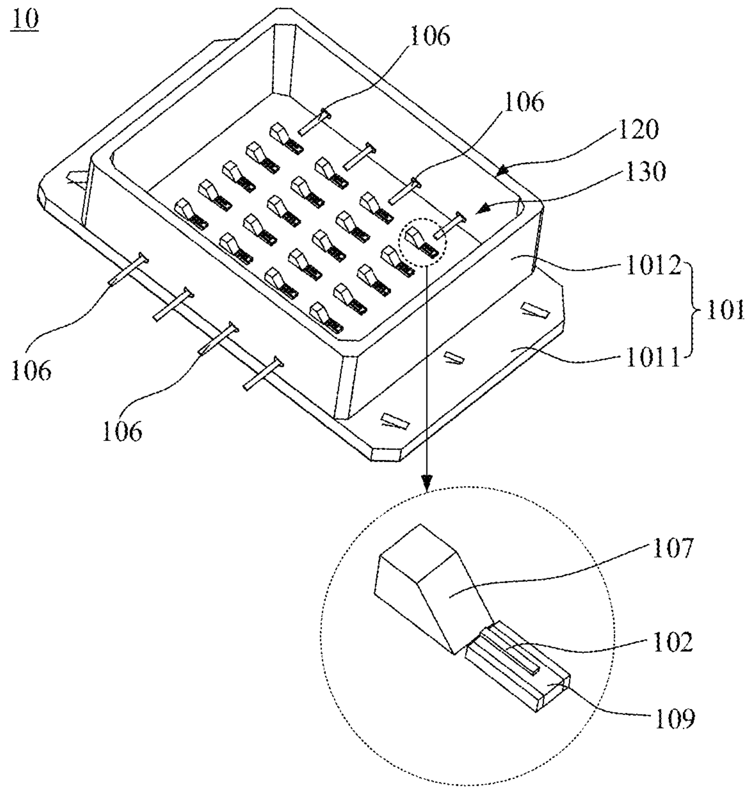
FIG. 3 is a diagram showing a structure of another laser device, in accordance with some embodiments.
Figure 4:
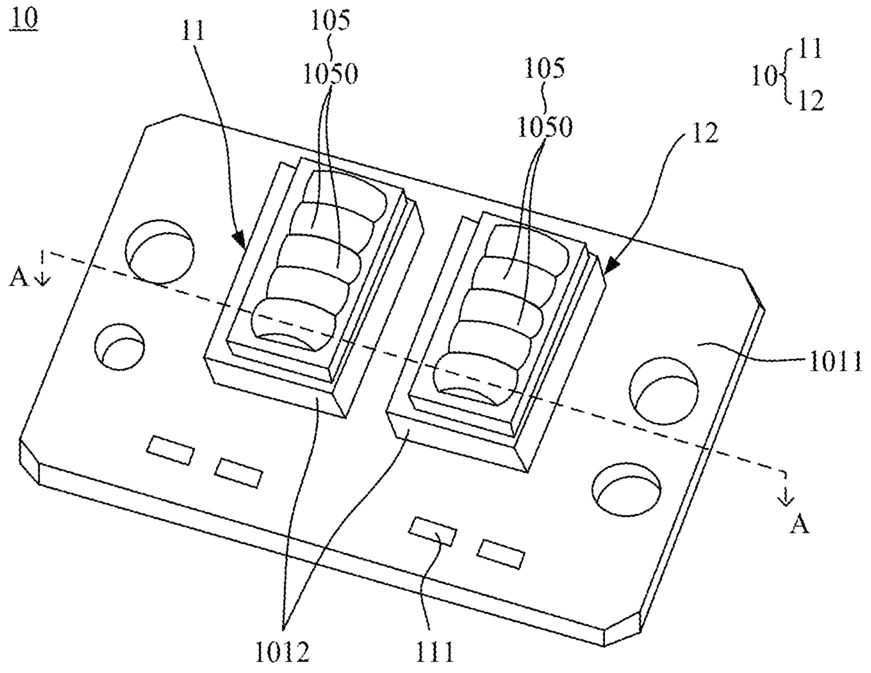
FIG. 4 is a diagram showing a structure of yet another laser device, in accordance with some embodiments.
Figure 5:
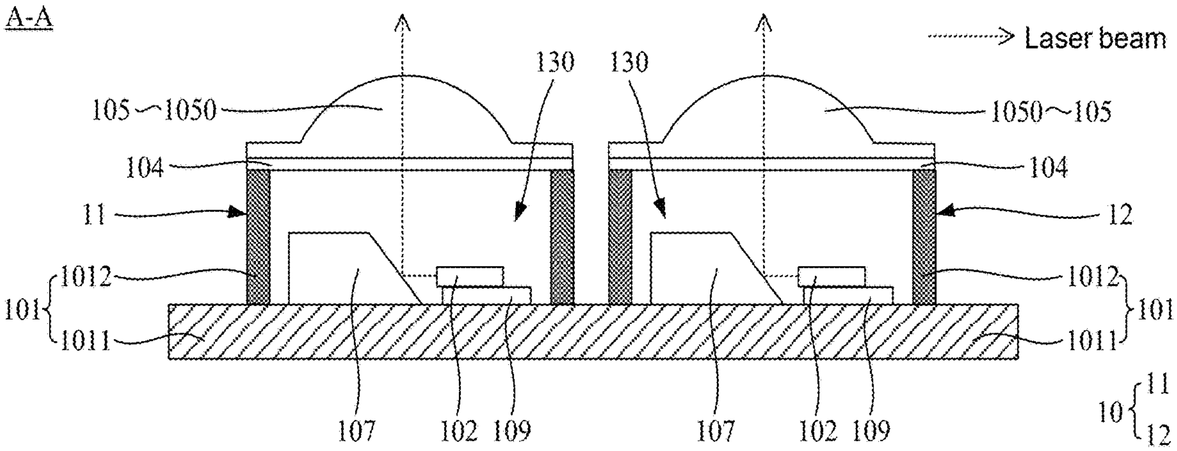
FIG. 5 is a sectional view of the laser device in FIG. 4 taken along the line A-A.

FIG. 3 is a diagram showing a structure of another laser device, in accordance with some embodiments. FIG. 4 is a diagram showing a structure of yet another laser device, in accordance with some embodiments. FIG. 5 is a sectional view of the laser device in FIG. 4 taken along the line A-A.

In some embodiments, as shown in FIGS. 2 and 3, a structure consisting of the base plate 1011 and the frame 1012 may be referred to as a tube shell 101 or a base assembly.

As shown in FIG. 3, a side of the tube shell 101 is open, so as to form an opening 120. In some embodiments, the light-transmitting layer 104 is configured to close the opening 120. Thus, the frame 1012, the light-transmitting layer 104 and the base plate 1011 may form an enclosed accommodating space 130, the plurality of light-emitting chips 102 are located in the accommodating space 130, so that water and oxygen may be avoided to corrode the light-emitting chips 102.

It will be noted that, the base plate 1011 and the frame 1012 may be a one-piece member or separate piece members. In a case where the base plate 1011 and the frame 1012 are the separate piece members, the base plate 1011 and the frame 1012 may be connected by means of welding.

In addition, in some embodiments, a plurality of laser devices 10 may share one base plate 1011. For example, as shown in FIGS. 4 and 5, the plurality of laser devices 10 include a first laser device 11 and a second laser device 12, and the first laser device 11 and the second laser device 12 share a same base plate 1011.

In some embodiments, the material of the frame 1012 includes copper, such as oxygen free copper (OFC). The copper has a high thermal conductivity, so that heat generated by the light-emitting chips 102 during operation may be dissipated by the frame 1012 in time. As a result, it is possible to prevent the light-emitting chips 102 from being damaged due to heat accumulation on the light-emitting chips 102, and prolong the service life of the light-emitting chips 102. Moreover, it is also possible to reduce the risk of breaking the light-transmitting layer 104 due to the fact that the heat generated by the light-emitting chips 102 during operation cannot be dissipated in time, improving the sealing effect of the accommodating space 130.

Of course, the material of the frame 1012 may also include at least one of aluminum or ceramics (e.g., aluminum nitride or silicon carbide).

In some embodiments, the plurality of light-emitting chips 102 are arranged in an array inside the accommodating space 130. The laser beams emitted by the plurality of light-emitting chips 102 may be incident on the collimating lens group 105, and exit from the laser device 10 after being collimated by the collimating lens group 105.

For example, as shown in FIG. 3, the laser device 10 further includes a reflector 107, and the reflector 107 is located on a laser-exit side of the light-emitting chip 102. The reflector 107 is configured to reflect the laser beam incident on the reflector 107. The reflector 107 and the light-emitting chip 102 may be mounted on the base plate 1011. The light-emitting chip 102 emits a laser beam along a direction parallel to a plane where the base plate 1011 is located. That is, a laser-exit direction of the light-emitting chip 102 is parallel to the base plate 1011. The laser beam emitted by the light-emitting chip 102 is reflected by the reflector 107 and then incident on the collimating lens group 105 along a direction away from the base plate 1011, and then exits from the laser device 10.

In some embodiments, the plurality of light-emitting chips 102 may be arranged in a matrix of M rows and N columns. Here, M and N are integers greater than or equal to 1, and at least one of M or N is greater than 1. Alternatively, the plurality of light-emitting chips 102 may be arranged in a staggered manner or in a honeycomb shape. Alternatively, the plurality of light-emitting chips 102 may be arranged in a polygonal shape, and the number of sides of the polygonal shape is greater than or equal to five.

In some embodiments, the plurality of light-emitting chips 102 may emit laser beams of a same color. In this case, the laser device 10 is a mono-color MCL device.

However, the plurality of light-emitting chips 102 may emit laser beams of different colors. In this case, the laser device 10 is a multi-color MCL device.

A multi-color MCL device may include a plurality of different light-emitting chips 102, and the different light-emitting chips 102 may emit laser beams of different colors. For example, the plurality of light-emitting chips 102 in the laser device 10 include a first light-emitting chip and a second light-emitting chip. The first light-emitting chip is configured to emit a first color laser beam. The second light-emitting chip is configured to emit a second color laser beam. A divergence angle of the first color laser beam is less than a divergence angle of the second color laser beam.

For example, the first color laser beam includes a blue laser beam and a green laser beam, and the first light-emitting chip includes a blue light-emitting chip and a green light-emitting chip. The second color laser beam includes a red laser beam, and the second light-emitting chip includes a red light-emitting chip. A divergence angle of the red laser beam emitted by the red light-emitting chip is greater than a divergence angle of the blue laser beam emitted by the blue light-emitting chip, and a divergence angle of the green laser beam emitted by the green light-emitting chip.

For example, the red light-emitting chip has a plurality of light-emitting points, and a size of a beam spot of the red laser beam emitted by the red light-emitting chip in the fast axis X may be substantially 350 μm. The blue light-emitting chip and the green light-emitting chip each have one light-emitting point, and sizes of beam spots of the laser beams emitted by the blue light-emitting chip and the green light-emitting chip in the fast axis X each may be substantially 35 μm. Moreover, sizes of the beam spots of the laser beams emitted by the red light-emitting chip, the blue light-emitting chip, and the green light-emitting chip in the slow axis Y each may be substantially 1 μm. In this way, a shape of the beam spot of the laser beam emitted by the light-emitting chip 102 in the laser device 10 is flat and long, and a length-to-width ratio of the beam spot is large.

However, the first color laser beam and the second color laser beam may also be laser beams of other colors, and the present disclosure is not limited thereto.

The following details are described by taking an example in which the laser device 10 is the multi-color MCL device, the first color laser beam includes the blue laser beam and the green laser beam, and the second color laser beam includes the red laser beam.

In some embodiments, as shown in FIG. 2, the light-transmitting layer 104 is fixed on the frame 1012 through the cover plate 103. For example, the cover plate 103 has a ring shape. The cover plate 103 includes an outer edge portion 1031, an inner edge portion 1032, and a bending portion 1030. The bending portion 1030 is located between the outer edge portion 1031 and the inner edge portion 1032. The inner edge portion 1032 is recessed toward the base plate 1011, and the outer edge portion 1031 is fixed on a surface of the frame 1012 away from the base plate 1011. The light-transmitting layer 104 is located on a side of the inner edge portion 1032 away from the base plate 1011, and is fixedly connected to the inner edge portion 1032.

In some embodiments, a thickness of the outer edge portion 1031 of the cover plate 103 is thin. The outer edge portion 1031 may be connected to the frame 1012 by a parallel sealing technology.

In a case where the outer edge portion 1031 of the cover plate 103 is fixed to the frame 1012 by the parallel sealing technology, the cover plate 103 is firstly placed on a side of the frame 1012 away from the base plate 1011, and the outer edge portion 1031 of the cover plate 103 overlaps the surface of the frame 1012 away from the base plate 1011. Then, the outer edge portion 1031 is heated by a parallel sealing device, so as to weld the outer edge portion 1031 together with the frame 1012.

In some embodiments, the cover plate 103 may be a sheet metal member, and all portions of the cover plate 103 have a same or substantially same thickness. The cover plate 103 may be made by a sheet metal process. For example, a piece of annular plate-shaped structure is stamped, so that a corresponding portion of the plate-shaped structure is bent, recessed, or protrudes, so as to obtain the cover plate 103.

In some embodiments, the cover plate 103 may be made of stainless steel. Alternatively, the cover plate 103 may be made of kovar alloy, such as an iron-nickel-cobalt alloy.

In some embodiments, side surfaces of the light-transmitting layer 104 may be fixedly connected to the inner edge portion 1032 of the cover plate 103 by means of an adhesive.

The light-transmitting layer 104 may be fixedly connected to the cover plate 103 before the cover plate 103 is fixedly connected to the tube shell 101. For example, the side surfaces of the light-transmitting layer 104 are fixedly connected to the inner edge portion 1032 of the cover plate 103 through the adhesive. The adhesive may cover the side surfaces of the light-transmitting layer 104, so as to improve the firmness of the light-transmitting layer 104. It will be noted that, the adhesive may include glass glue, a low-temperature glass solder, epoxy resin, or other glue.

In some embodiments, the light-transmitting layer 104 may be made of glass. Alternatively, the light-transmitting layer 104 may be made of other materials with high light transmittance and high reliability, such as resin.

In some embodiments, the light-transmitting layer 104 may be directly connected to the cover plate 103. Alternatively, the laser device 10 further includes a fixing frame, and the fixing frame is configured to support the light-transmitting layer 104. The light-transmitting layer 104 may be fixedly connected to the fixing frame, and the fixing frame is fixedly connected to the cover plate 103.

For example, the fixing frame includes a fixing frame body and at least two support plates. The fixing frame body has a rectangular ring shape, and a region (e.g., a middle region) enclosed by the fixing frame body is a first hollowed-out region. The at least two support plates are connected to the fixing frame body, and located in the first hollowed-out region. In this way, the middle region of the light-transmitting layer 104 may be supported by the fixing frame, so as to improve the firmness of the light-transmitting layer 104.

In some embodiments, the laser device 10 may further include a brightness enhancement film, and the brightness enhancement film is disposed on at least one of a surface of the light-transmitting layer 104 proximate to or away from the base plate 1011, so as to enhance the brightness of the laser beams exiting from the laser device 10.

Figure 6:
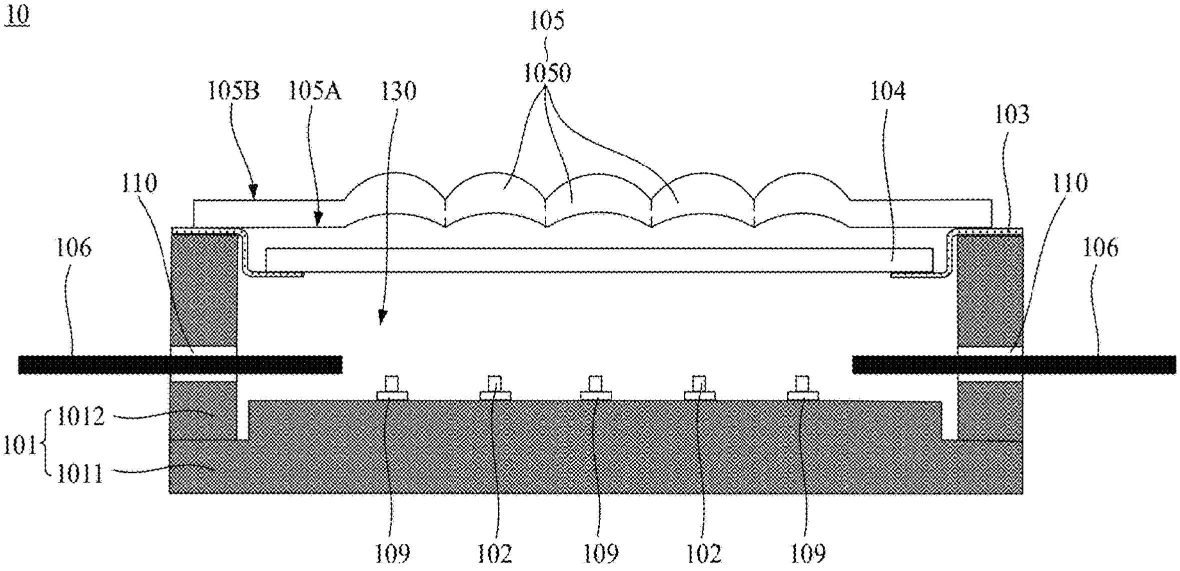
FIG. 6 is a diagram showing a structure of yet another laser device, in accordance with some embodiments.

FIG. 6 is a diagram showing a structure of yet another laser device, in accordance with some embodiments.

In some embodiments, as shown in FIGS. 2 and 6, the laser device 10 further includes a heat sink 109. The heat sink 109 is disposed on the base plate 1011, and the light-emitting chip 102 is disposed on a side of the heat sink 109 away from the base plate 1011. The heat sink 109 may conduct the heat generated by the light-emitting chip 102 during operation to the base plate 1011 in time, so as to dissipate the heat of the light-emitting chip 102.

In some embodiments, as shown in FIG. 6, the laser device 10 further includes a plurality of conductive pins 106, and the plurality of conductive pins 106 are symmetrically disposed on two sides of the frame 1012. The frame 1012 includes a plurality of through holes 110 corresponding to the plurality of conductive pins 106. The plurality of conductive pins 106 may run through the plurality of through holes 110 of the frame 1012 and extend into the accommodating space 130, respectively. Portions of the plurality of conductive pins 106 located outside the accommodating space 130 each are electrically connected to an external power source. Portions of the plurality of conductive pins 106 located inside the accommodating space 130 each are electrically connected to electrodes of the corresponding light-emitting chips 102, so that the plurality of conductive pins 106 may transmit an external current from the external power source to all light-emitting chips 102, so as to activate the light-emitting chips 102 to emit laser beams.

In some embodiments, a diameter of the through hole 110 is greater than a diameter of the conductive pin 106, so as to facilitate the insertion of the conductive pin 106 into the through hole 110. For example, the diameter of the through hole 110 is 1.2 mm and the diameter of the conductive pin 106 is 0.55 mm.

When the laser device 10 is assembled, first a ring-shaped first solder (e.g., a ring-shaped glass bead) may be placed in the through hole 110 of the frame 1012, and the conductive pin 106 may be inserted through the first solder. Then, the frame 1012 is placed on the base plate 1011, and a ring-shaped second solder is placed between the base plate 1011 and the frame 1012. The second solder may include silver or copper. Next, a structure consisting of the base plate 1011, the frame 1012, and the conductive pins 106 is placed in a high temperature furnace for sintering. After sintering, the base plate 1011, the frame 1012, the conductive pins 106, and the solders (including the first solder and the second solder) may be cured and integrated, so as to complete the assembly of the laser device 10.

The welding process in some embodiments of the present disclosure may also be replaced by other processes, and the order of assembling the components may also be adjusted, and the present disclosure is not limited thereto.

It will be noted that, in a case where the frame 1012 is made of ceramics, the material of the base plate 1011 may include copper, and the frame 1012 is fixedly connected with the base plate 1011 by a brazing process. In this case, a conductive layer may be provided in the base plate 1011, and the light-emitting chips 102 may be electrically connected with the external power source through the conductive layer. In this way, there is no need to provide the conductive pins 106 on the frame 1012, and a portion (e.g., the conductive connection point 111 shown in FIG. 4) of the conductive layer electrically connected with the external power source may be disposed at an edge of the base plate 1011, so as to facilitate the miniaturization of the laser device 10.

In some embodiments, the collimating lens group 105 is disposed on the side of the frame 1012 away from the base plate 1011, and is fixedly connected to the frame 1012. For example, as shown in FIG. 2, in a case where the laser device 10 includes the cover plate 103, the collimating lens group 105 is disposed on a side of the cover plate 103 away from the base plate 1011, an edge of the collimating lens group 105 is fixedly connected to the frame 1012 through the outer edge portion 1031 of the cover plate 103.

In some embodiments, the edge of the collimating lens group 105 may be bonded to the outer edge portion 1031 of the cover plate 103 through the adhesive.

For example, after the cover plate 103 is fixedly connected to the tube shell 101, the collimating lens group 105 may be suspended above a side of the light-transmitting layer 104 away from the base plate 1011, and collimation adjustment of the laser beam may be performed. After a position of the collimating lens group 105 is determined, the adhesive is applied to the outer edge portion 1031 of the cover plate 103, so that the collimating lens group 105 is fixedly connected to the cover plate 103 through the adhesive.

In some embodiments, the collimating lens group 105 may also directly enclose with the frame 1012 and the base plate 1011 to form the enclosed accommodating space 130. As a result, there is no need to provide the cover plate 103 and the light-transmitting layer 104, so as to simplify a structure of the laser device 10, and reduce the cost.

In some embodiments, as shown in FIG. 2, the collimating lens group 105 includes a plurality of collimating lens 1050. The plurality of collimating lenses 1050 and the plurality of light-emitting chips 102 are arranged in a one-to-one correspondence manner, and the laser beam emitted by each light-emitting chip 102 is reflected to the corresponding collimating lens 1050 by the corresponding reflector 107. The collimating lens 1050 is configured to reduce a divergence angle of the laser beam incident on the collimating lens 1050, so that a reduction of a divergence angle of the laser beam in the slow axis Y (i.e., a first axis) is less than a reduction of a divergence angle of the laser beam in the fast axis X (i.e., a second axis). In this way, the collimating effect of the collimating lens 1050 on the laser beam in the fast axis X is stronger than the collimating effect of the collimating lens 1050 on the laser beam in the slow axis Y, so as to reduce a difference between the divergence angles of the laser beam passing through the collimating lens 1050 in the fast axis X and slow axis Y.

In some embodiments, the collimating lenses 1050 may be made of glass.

In some embodiments, an arrangement manner of the plurality of collimating lenses 1050 corresponds to an arrangement manner of the plurality of light-emitting chips 102.

For example, in a case where the plurality of light-emitting chips 102 are arranged in a matrix of M rows and N columns, the plurality of collimating lenses 1050 are also arranged in the matrix of M rows and N columns. In a case where the plurality of light-emitting chips 102 are arranged in a staggered manner or in a honeycomb shape, the plurality of collimating lenses 1050 may also be arranged in the staggered manner or in the honeycomb shape. In a case where the plurality of light-emitting chips 102 are arranged in a polygonal shape, the plurality of collimating lenses 1050 are also arranged in the polygonal shape.

Figure 7:
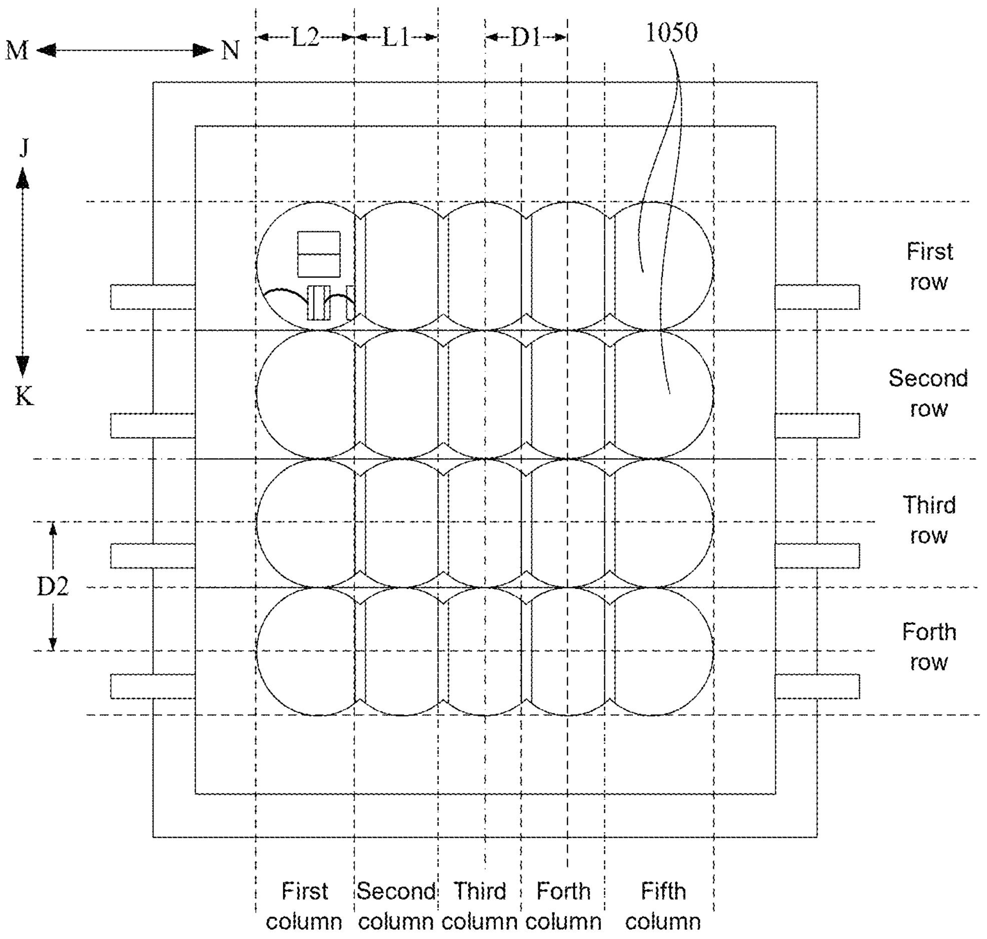
FIG. 7 is a diagram showing a structure of a collimating lens group, in accordance with some embodiments.

FIG. 7 is a diagram showing a structure of a collimating lens group, in accordance with some embodiments.

In some embodiments, the slow axis Y of the laser beam incident on the collimating lens group 105 is parallel to a row direction of the light-emitting chips 102 or a row direction of the collimating lens group 105 (the first direction MN shown in FIG. 7), and the fast axis X of the laser beam incident on the collimating lens group 105 is parallel to a column direction of the light-emitting chips 102 or a column direction of the collimating lens group 105 (the second direction JK shown in FIG. 7).

It will be noted that, the plurality of collimating lenses 1050 of the collimating lens group 105 and the plurality of light-emitting chips 102 are arranged in a one-to-one correspondence manner. Therefore, the row direction and the column direction of the light-emitting chips 102 are the same as the row direction and the column direction of the collimating lens group 105, respectively.

In some embodiments, a distance between two adjacent rows of the collimating lenses 1050 in the column direction (e.g., the second direction JK) of the collimating lens group 105 is greater than a distance between two adjacent columns of the collimating lenses 1050 in the row direction (e.g., the first direction MN) of the collimating lens group 105. It will be noted that, the distance between two adjacent rows or two adjacent columns of collimating lenses 1050 may refer to a minimum distance between centers of two adjacent rows or two adjacent columns of collimating lenses 1050. Alternatively, the distance between two adjacent rows or two adjacent columns of collimating lenses 1050 may also refer to a minimum distance between vertexes of two adjacent rows or two adjacent columns of collimating lenses 1050.

For example, as shown in FIG. 7, the collimating lenses 1050 of the collimating lens group 105 are arranged in an array of 4×5, and a second distance D2 between two adjacent rows of collimating lenses 1050 is greater than a first distance D1 between two adjacent columns of collimating lenses 1050.

The slow axis Y and the fast axis X of the laser beam incident on the collimating lens group 105 are parallel to the row direction and the column direction of the collimating lens group 105, respectively, and the divergence angle of the laser beam in the fast axis X is greater than the divergence angle of the laser beam in the slow axis Y. Therefore, a size of a beam of laser beam incident on the collimating lens group 105 in the row direction of the collimating lens group 105 is less than a size of the beam of laser beam incident on the collimating lens group 105 in the column direction of the collimating lens group 105. In this way, the distance between two adjacent columns of collimating lenses 1050 in the first direction MN may be less than the distance between two adjacent rows of collimating lenses 1050 in the second direction JK, so as to reduce a size of the collimating lens group 105, and facilitate the miniaturization of the laser device 10 and the optical assembly.

In some embodiments, widths of two rows of collimating lenses 1050 on both sides of the collimating lens group 105 in the first direction MN each are greater than widths of other rows of collimating lenses 1050 of the collimating lens group 105 in the first direction MN. For example, as shown in FIG. 7, a second width L2 of the first row of collimating lenses 1050 is greater than a first width L1 of the second row of collimating lenses 1050 of the collimating lens group 105.

In some embodiments, the collimating lenses 1050 in different rows or columns have different curvatures in the slow axis Y (e.g., the first direction MN) or the fast axis X (e.g., the second direction JK). Moreover, the curvature of a collimating lens 1050 in the slow axis Y is different from the curvature of the collimating lens 1050 in the fast axis X. In this way, a change amount of the divergence angle of the laser beam incident on the collimating lens 1050 in the slow axis Y is different from a change amount of the divergence angle of the laser beam incident on the collimating lens 1050 in the fast axis X.

It will be noted that, the slow axis Y and the fast axis X in some embodiments of the present disclosure refer to the fast axis X and the slow axis Y of the laser beam incident on the collimating lens group 105.

Generally, a divergence angle of the laser beam emitted by the light-emitting chip 102 in the fast axis X is greater than a divergence angle of the laser beam in the slow axis Y, and there is a large difference between the divergence angles of the laser beam in the fast axis X and slow axis Y. For example, the divergence angle of the laser beam emitted by the light-emitting chip 102 in the fast axis X is within a range of 25° to 35° inclusive, and the divergence angle of the laser beam emitted by the light-emitting chip 102 in the slow axis Y is within a range of 5° to 7° inclusive. The collimating lens of the laser device in the related art includes two opposite surfaces, one of the two surfaces is a plane and another of the two surfaces is a convex curved surface. The collimating lens collimates the laser beam incident on the collimating lens through the convex curved surface.

However, the convex curved surface is a portion of a spherical surface and curvatures of the convex curved surface in all directions are same. Therefore, the convex curved surface has a same collimating effect on the laser beam in the fast axis X and slow axis Y, and a reduction of the divergence angle of the laser beam passing through the collimating lens in the fast axis X is the same as a reduction of the divergence angle of the laser beam passing through the collimating lens in the slow axis Y. Therefore, there is still a large difference between the divergence angles of the laser beam passing through the collimating lens in the fast axis X and slow axis Y, which causes a poor collimation degree of the laser beams exiting from the laser device.

In the laser device 10 of some embodiments of the present disclosure, the collimating lens 1050 may make a reduction of the divergence angle of the laser beam incident on the collimating lens 1050 in the slow axis Y less than a reduction of the divergence angle of the laser beam incident on the collimating lens 1050 in the fast axis X after the laser beam passes through the collimating lens 1050. In this way, the collimating lens 1050 has a stronger collimation effect on the laser beam in the fast axis X than in the slow axis Y. The difference between the divergence angles of the laser beam emitted by the light-emitting chip 102 in the fast axis X and the slow axis Y is reduced after the laser beam passes through the collimating lens 1050, so as to improve the overall collimating effect of the collimating lens group 105 on the laser beam.

The collimating lens 1050 of the laser device 10 according to some embodiments of the present disclosure is described in detail below.

Figure 8:
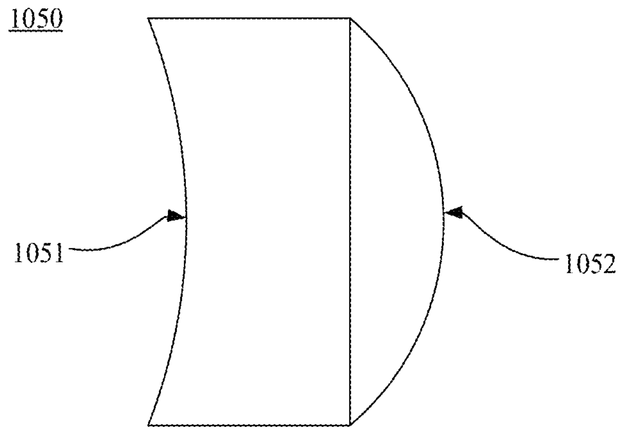
FIG. 8 is a diagram showing a structure of a collimating lens, in accordance with some embodiments.

FIG. 8 is a diagram showing a structure of a collimating lens, in accordance with some embodiments.

In some embodiments, as shown in FIG. 8, the collimating lens 1050 has a cylindrical shape, and the collimating lens 1050 includes a first surface 1051 and a second surface 1052. The first surface 1051 and the second surface 1052 are disposed opposite to each other, and the first surface 1051 is closer to the base plate 1011 than the second surface 1052. After the laser beam emitted by the light-emitting chip 102 is reflected by the reflector 107 to the collimating lens 1050, the laser beam is incident on the first surface 1051 and exits from the second surface 1052.

In some embodiments, the first surface 1051 includes a plane and the second surface 1052 includes a convex curved surface. The convex curved surface protrudes in the direction away from the base plate 1011, and a curvature of the convex curved surface in the slow axis Y is less than a curvature of the convex curved surface in the fast axis X.

In some other embodiments, the first surface 1051 includes a concave curved surface, and the second surface 1052 includes a convex curved surface. The concave curved surface is recessed in the direction away from the base plate 1011, and a curvature radius of the concave curved surface in the slow axis Y is less than a curvature radius of the concave curved surface in the fast axis X. Since the curvature is a reciprocal of the curvature radius, a curvature of the concave curved surface in the slow axis Y is greater than a curvature of the concave curved surface in the fast axis X.

It will be noted that, in a case where the first surface 1051 is the concave curved surface, the second surface 1052 (i.e., the convex curved surface) protrudes in the direction away from the base plate 1011, and a curvature of the second surface 1052 in the slow axis Y may be less than or equal to a curvature of the second surface 1052 in the fast axis X.

The following details are described by taking an example in which the first surface 1051 is the concave curved surface and the second surface 1052 is the convex curved surface.

In some embodiments, an entire region of the first surface 1051 may be the concave curved surface, or a partial region of the first surface 1051 may be the concave curved surface. An entire region of the second surface 1052 may be the convex curved surface, or a partial region of the second surface 1052 may be the convex curved surface, and the present disclosure is not limited thereto.

The concave curved surface (i.e., the first surface 1051) of the collimating lens 1050 is configured to increase a divergence angle of the laser beam incident on the concave curved surface. The concave curved surface may diffuse the laser beam incident on the concave curved surface. The larger the curvature radius of the concave curved surface, the smaller the curvature and bending degree of the concave curved surface, the weaker the divergence effect of the concave curved surface on the laser beam, and the less an increase of the divergence angle of the laser beam passing through the concave curved surface.

The curvature radius of the concave curved surface of the collimating lens 1050 in the slow axis Y is less than the curvature radius of the concave curved surface of the collimating lens 1050 in the fast axis X. Therefore, an increase of the divergence angle of the laser beam in the fast axis X is less than an increase of the divergence angle of the laser beam in the slow axis Y after the laser beam emitted by the light-emitting chip 102 passes through the concave curved surface of the collimating lens 1050. In this way, there is a small difference between the divergence angle of the laser beam in the slow axis Y and the divergence angle of the laser beam in the fast axis X after the laser beam passes through the concave curved surface of the collimating lens 1050.

For example, compared to the collimating lens in the related art, in some embodiments of the present disclosure, the divergence angle of the laser beam in the slow axis Y may be increased by any value within a range of 1.5° to 2.5° after the laser beam passes through the concave curved surface of the collimating lens 1050. For example, the divergence angle of the laser beam in the slow axis Y is increased by 1.5°, 1.7°, 2.0°, 2.3°, or 2.5°. The divergence angle of the laser beam in the fast axis X may be increased by any value within a range of 1.1° to 1.5°. For example, the divergence angle of the laser beam in the fast axis X is increased by 1.1°, 1.2°, 1.3°, 1.4°, or 1.5°. However, the divergence angle of the laser beam in the fast axis X may also be unchanged.

In some embodiments, the concave curved surface of the collimating lens 1050 may be a cylindrical surface, and a straight generatrix of the cylindrical surface is parallel to the fast axis X of the laser beam incident on the concave curved surface. It will be noted that, the cylindrical surface refers to a curved surface formed by a straight line moving in parallel along a curved line, and the straight line may be referred to as the straight generatrix of the cylindrical surface. For example, the cylindrical surface is a portion of a side surface of a cylinder, and the straight generatrix of the cylindrical surface is parallel to a height direction of the cylinder.

In a case where the concave curved surface of the collimating lens 1050 is the cylindrical surface, in the fast axis X of the laser beam incident on the concave curved surface, the curvature of the concave curved surface is 0; in the slow axis Y of the laser beam incident on the concave curved surface, the curvature of the concave curved surface is greater than 0. In this way, the curvature radius of the concave curved surface tends to infinity in the fast axis X, and the concave curved surface is approximately a plane in the fast axis X, so that the increase of the divergence angle of the laser beam incident on the concave curved surface in the fast axis X is substantially the same as the increase of the divergence angle of the laser beam incident on a plane glass, and the increase of the divergence angle tends to 0. The concave curved surface has a large bending degree in the slow axis Y, and the increase of the divergence angle of the laser beam in the slow axis Y is greater than the increase of the divergence angle of the laser beam in the fast axis X.

The laser beam incident on the collimating lens 1050 may exit from the convex curved surface of the collimating lens 1050 after passing through the concave curved surface of the collimating lens 1050. The convex curved surface may converge the laser beam incident on the convex curved surface, so as to collimate the laser beam incident on the convex curved surface.

The convex curved surface of the collimating lens 1050 is configured to reduce the divergence angle of the laser beam incident on the convex curved surface. The convex curved surface may converge the laser beam incident on the convex curved surface. The larger the curvature radius of the convex curved surface, the smaller the curvature and bending degree of the convex curved surface, the weaker the converging effect of the convex curved surface on the laser beam, and the less the reduction of the divergence angle of the laser beam passing through the convex curved surface.

In some embodiments, the curvature of the convex curved surface of the collimating lens 1050 in the slow axis Y is the same as the curvature of the convex curved surface of the collimating lens 1050 in the fast axis X. For example, the convex curved surface is a portion of a spherical surface, and the curvatures of the convex curved surface in all directions are same. In this case, the first surface 1051 of the collimating lens 1050 may be a cylindrical surface, as long as the increase of the divergence angle of the laser beam passing through the first surface 1051 in the fast axis X is less than the increase of the divergence angle of the laser beam passing through the first surface 1051 in the slow axis Y.

Since the first surface 1051 (e.g., the concave curved surface) of the collimating lens 1050 has made the difference between the divergence angles of the laser beam in the fast axis X and slow axis Y small, the convex curved surface of the collimating lens 1050 may perform an integral collimation on the laser beam, so as to make the reduction of the divergence angle of the laser beam in the fast axis X substantially the same as the divergence angle of the laser beam in the slow axis Y after the laser beam passes through the second surface 1052. Thus, there is no need to make the curvatures of the convex curved surface in different directions different, which reduces the manufacturing difficulty of the collimating lens 1050.

Of course, in some embodiments, the curvature radius of the convex curved surface of collimating lens 1050 in the slow axis Y may be different from the curvature radius of the convex curved surface of collimating lens 1050 in the fast axis X.

For example, the curvature radius of the convex curved surface of the collimating lens 1050 in the slow axis Y is greater than the curvature radius of the convex curved surface of the collimating lens 1050 in the fast axis X. That is, the curvature of the convex curved surface of the collimating lens 1050 in the slow axis Y is less than the curvature of the convex curved surface of the collimating lens 1050 in the fast axis X.

For another example, the convex curved surface of the collimating lens 1050 is a cylindrical surface, and a straight generatrix of the cylindrical surface is parallel to the slow axis Y.

Thus, in a case where the laser beam is incident on the convex curved surface after passing through the concave curved surface, the convex curved surface may readjust the divergence angles of the laser beam incident on the convex curved surface in the fast axis X and slow axis Y. As a result, the reduction of the divergence angle of the laser beam in the fast axis X is greater than the reduction of the divergence angle of the laser beam in the slow axis Y after the laser beam passes through the convex curved surface, so as to further reduce the difference between the divergence angles of the laser beam exiting from the collimating lens 1050 in the fast axis X and slow axis Y.

In some embodiments, the curvature radius of the concave curved surface of collimating lens 1050 may be greater than the curvature radius of the convex curved surface of collimating lens 1050. A ratio of the curvature radius of the concave curved surface to the curvature radius of the convex curved surface may be any value within a range of 1.5 to 4. For example, the ratio of the curvature radius of the concave curved surface to the curvature radius of the convex curved surface is 1.5, 2, 2.5, 3, 3.5, or 4.

For example, in a case where the concave curved surface of the collimating lens 1050 is curved only in the slow axis Y, the curvature radius of the concave curved surface may refer to the curvature radius of the concave curved surface in the slow axis Y. A ratio of the curvature radius of the concave curved surface in the slow axis Y to the curvature radius of the convex curved surface in the fast axis X or the slow axis Y may be any value within the range of 1.5 to 4 inclusive.

For another example, the curvature radiuses of the concave curved surface in the fast axis X and slow axis Y each may be greater than the curvature radiuses of the convex curved surface in the fast axis X and slow axis Y. In this way, the collimating lens 1050 may converge the laser beam as a whole, so that a divergence angle of the laser beam exiting from the collimating lens 1050 may be less than a divergence angle of the laser beam incident on the collimating lens 1050. For example, a total focal length F of the collimating lens 1050 may be greater than 0, the total focal length $F=1/R2-1/R1$. Here, R2 represents the curvature radius of the convex curved surface of the collimating lens 1050, and R1 represents the curvature radius of the concave curved surface of the collimating lens 1050.

Figure 9:
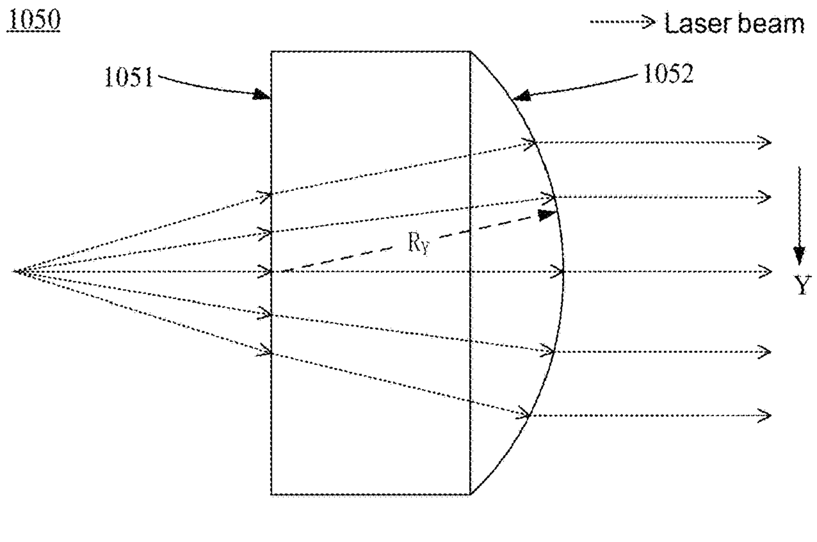
FIG. 9 is a diagram showing an optical path of a laser beam incident on a collimating lens in a slow axis, in accordance with some embodiments.
Figure 10:
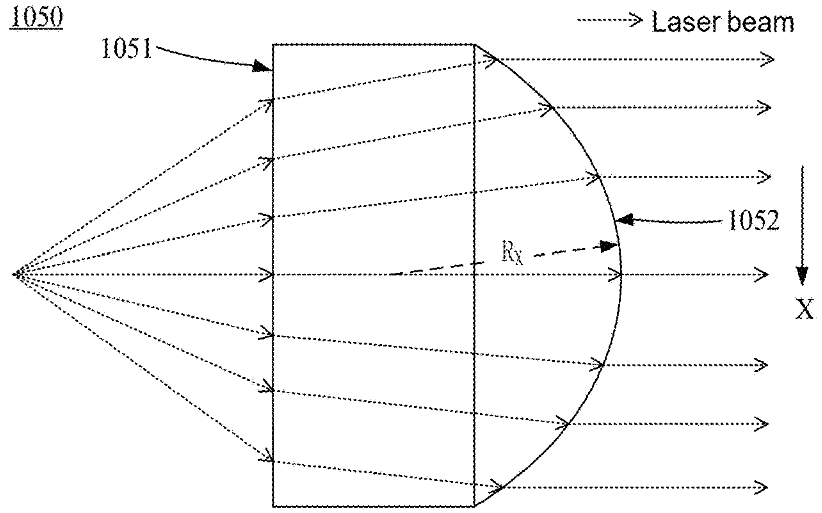
FIG. 10 is a diagram showing an optical path of a laser beam incident on a collimating lens in a fast axis, in accordance with some embodiments.

FIG. 9 is a diagram showing an optical path of a laser beam incident on a collimating lens in a slow axis, in accordance with some embodiments. FIG. 10 is a diagram showing an optical path of a laser beam incident on a collimating lens in a fast axis, in accordance with some embodiments.

The above description is mainly given by taking an example in which the first surface 1051 of the collimating lens 1050 is a concave curved surface. However, in some embodiments, the first surface 1051 of the collimating lens 1050 may also be a plane.

For example, as shown in FIGS. 9 and 10, the first surface 1051 of the collimating lens 1050 is a plane, and the second surface 1052 of the collimating lens 1050 is a convex curved surface. The convex curved surface protrudes in the direction away from the base plate 1011, and a curvature radius of the convex curved surface in the slow axis Y of the laser beam is greater than a curvature radius of the convex curved surface in the fast axis X of the laser beam. That is to say, a curvature of the convex curved surface in the slow axis Y of the laser beam is less than a curvature of the convex curved surface in the fast axis X of the laser beam. For example, a curvature radius RY of the convex curved surface in FIG. 9 is greater than a curvature radius Rx of the convex curved surface in FIG. 10.

In this case, the collimating lens 1050 may be referred to as a free-form lens. For example, the convex curved surface of the collimating lens 1050 may be substantially a same shape as a portion of a surface of a rugby.

In some embodiments, the collimating lens 1050 satisfies at least one of the following, the curvature radius of the convex curved surface of the collimating lens 1050 in the slow axis Y is any value within a range of 3.50 mm to 4.00 mm, or, the curvature radius of the convex curved surface of the collimating lens 1050 in the fast axis X is any value within a range of 3.10 mm to 3.30 mm. For example, the curvature radius of the convex curved surface in the slow axis Y is 3.50 mm, 3.60 mm, 3.70 mm, 3.80 mm, 3.90 mm, or 4.00 mm. The curvature radius of the convex curved surface in the fast axis X is 3.10 mm, 3.15 mm, 3.20 mm, 3.25 mm, 3.282 mm, and 3.30 mm.

In some embodiments of the present disclosure, since the first surface 1051 of the collimating lens 1050 is planar, a change amount of the divergence angle of the laser beam passing through the first surface 1051 in the slow axis Y is the same as a change amount of the divergence angle of the laser beam passing through the first surface 1051 in the fast axis X. There is still a large difference between the divergence angles of the laser beam in the fast axis X and slow axis Y after the laser beam passes through the first surface 1051.

In this way, there is still a large difference between the divergence angles of the laser beam incident on the convex curved surface of the collimating lens 1050 in the fast axis X and slow axis Y. Since the curvature radius of the convex curved surface of the collimating lens 1050 in the slow axis Y is greater than the curvature radius of the convex curved surface of the collimating lens 1050 in the fast axis X, a reduction of the divergence angle of the laser beam passing through the convex curved surface in the fast axis X is greater than a reduction of the divergence angle of the laser beam passing through the convex curved surface in the slow axis Y, so that the difference between the divergence angles of the laser beam exiting from the collimating lens 1050 in the fast axis X and slow axis Y is reduced.

Figure 11:
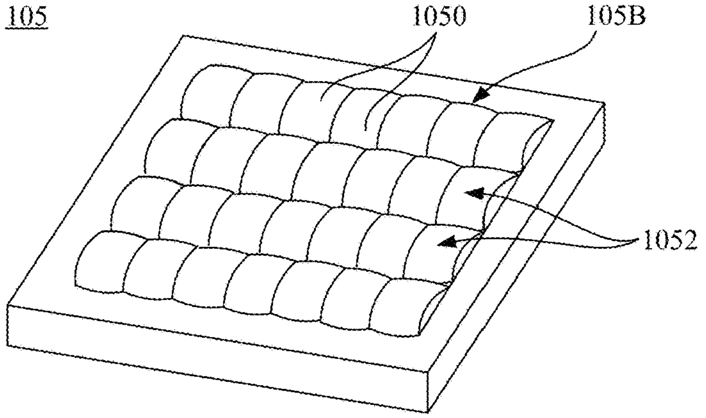
FIG. 11 is a diagram showing a structure of another collimating lens group, in accordance with some embodiments.
Figure 12:
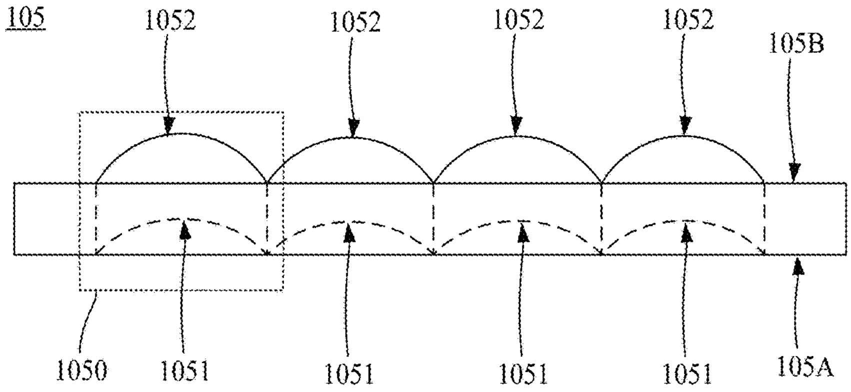
FIG. 12 is a diagram showing a structure of yet another collimating lens group, in accordance with some embodiments.
Figure 13:
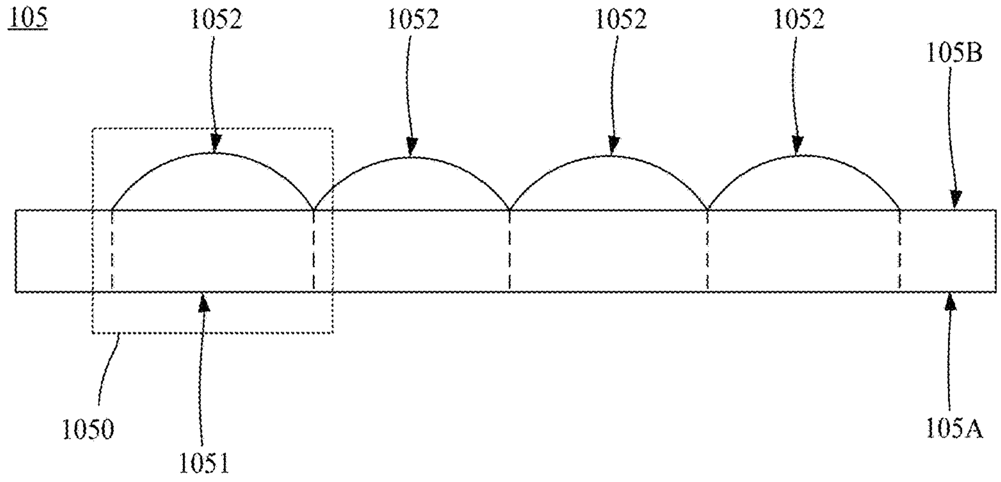
FIG. 13 is a diagram showing a structure of yet another collimating lens group, in accordance with some embodiments.

FIG. 11 is a diagram showing a structure of another collimating lens group, in accordance with some embodiments. FIG. 12 is a diagram showing a structure of yet another collimating lens group, in accordance with some embodiments. FIG. 13 is a diagram showing a structure of yet another collimating lens group, in accordance with some embodiments. FIGS. 12 and 13 each are side views of the collimating lens group 105 shown in FIG. 11.

In some embodiments, the collimating lens group 105 may be a one-piece member.

As shown in FIGS. 12 and 13, the collimating lens group 105 includes a laser-incident surface 105A and a laser-exit surface 105B, and the laser-incident surface 105A and the laser-exit surface 105B are disposed opposite to each other. The laser-incident surface 105A is closer to the base plate 1011 than the laser-exit surface 105B. The laser-incident surface 105A of the collimating lens group 105 includes the first surfaces 1051 of all collimating lenses 1050 of the collimating lens group 105, and the laser-exit surface 105B includes the second surfaces 1052 of all collimating lenses 1050 of the collimating lens group 105.

In some embodiments, as shown in FIG. 12, the laser-incident surface 105A of the collimating lens group 105 includes a plurality of concave curved surfaces, the laser-exit surface 105B of the collimating lens group 105 includes a plurality of convex curved surfaces, and the plurality of concave curved surfaces correspond to the plurality of convex curved surfaces, respectively. A portion of the collimating lens group 105 where each concave curved surface and the corresponding convex curved surface are located forms a collimating lens 1050.

In some embodiments, an orthogonal projection of each convex curved surface on the laser-incident surface 105A of the collimating lens group 105 may coincide with an orthogonal projection of the corresponding convex curved surface on the laser-incident surface 105A.

In some embodiments, as shown in FIG. 13, the laser-incident surface 105A of the collimating lens group 105 is a plane, and the laser-exit surface 105B of the collimating lens group 105 includes a plurality of convex curved surfaces. A portion of the collimating lens group 105 where each convex curved surface and the corresponding plane are located forms a collimating lens 1050.

Figure 14:
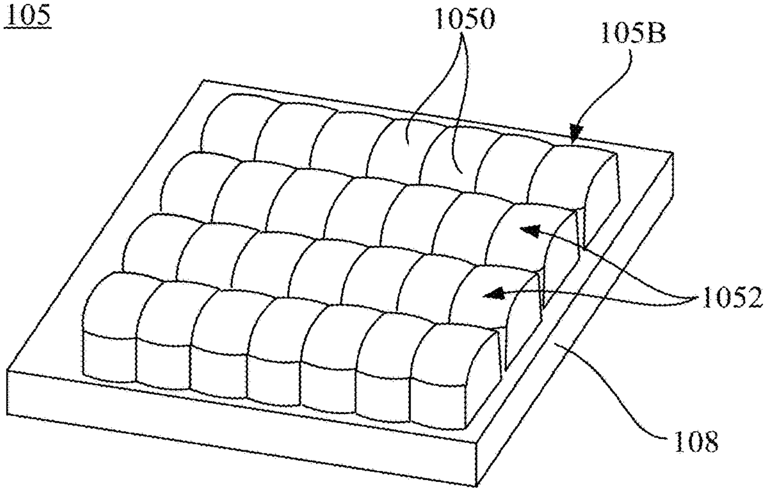
FIG. 14 is a diagram showing a structure of yet another collimating lens group, in accordance with some embodiments.

FIG. 14 is a diagram showing a structure of yet another collimating lens group, in accordance with some embodiments.

In some embodiments, the collimating lens group 105 may also be separate piece members. The collimating lens group 105 includes a plurality of separate collimating lenses 1050.

For example, as shown in FIG. 14, the laser device 10 includes a support frame 108 and a plurality of second hollowed-out regions. At least a portion of the support frame 108 is fixedly connected to the surface of the outer edge portion 1031 of the cover plate 103 away from the frame 1012, and the plurality of second hollowed-out regions are disposed on the support frame 108. The plurality of collimating lenses 1050 of the collimating lens group 105 may cover the plurality of second hollowed-out regions respectively. The plurality of second hollowed-out regions and the plurality of light-emitting chips 102 are arranged in a one-to-one correspondence manner, and the laser beam emitted by each light-emitting chip 102 may pass through the corresponding second hollowed-out region and be incident on the collimating lens 1050 covering the second hollowed-out region.

In some embodiments, one row or one column of the collimating lenses 1050 of the collimating lens group 105 each may also be a one-piece member, so as to form a collimating portion. The collimating lens group 105 includes a plurality of collimating portions. It will be noted that, the collimating portion may also be integrally formed by two or more rows of collimating lenses 1050.

In some embodiments, the collimating lenses corresponding to the laser beams of different wavelengths have different curvatures. Thus, the change amounts of the divergence angles of the laser beams of different wavelengths are different from each other after the laser beams of different wavelengths each pass through the corresponding collimating lenses 1050.

In some embodiments, the collimating lens group 105 is configured to make a reduction of a divergence angle of the first color laser beam passing through the collimating lens 1050 corresponding to the first light-emitting chip less than a reduction of a divergence angle of the second color laser beam passing through the collimating lens 1050 corresponding to the second light-emitting chip.

Divergence angles of the red laser beam in the fast axis X and slow axis Y are greater than divergence angles of the green laser beam and the blue laser beam in the fast axis X and slow axis Y. Alternatively, the divergence angle of the red laser beam in the fast axis X is greater than the divergence angles of the green laser beam and the blue laser beam in the fast axis X, the divergence angle of the red laser beam in the slow axis Y is greater than the divergence angles of the green laser beam and the blue laser beam in the slow axis Y, but the divergence angle of the red laser beam in the slow axis Y is less than the divergence angles of the blue laser beam and the green laser beam in the fast axis X.

Therefore, in some embodiments, it is possible to adjust the reductions of the divergence angle of the laser beam by the collimating lenses 1050 corresponding to different light-emitting chips 102 according to different divergence angles of the red, blue and green laser beams in the fast axis X and slow axis Y. For example, the reductions of the divergence angles of the laser beams of different colors by the collimating lens 1050 are adjusted by adjusting the curvature radiuses of the convex curved surface of the collimating lens 1050 in the fast axis X and slow axis Y.

For example, the divergence angle of the red laser beam in the fast axis X is greater than the divergence angle of the blue laser beam in the fast axis X, the divergence angle of the blue laser beam in the slow axis Y is less than the divergence angle of the red laser beam in the slow axis Y, and the divergence angle of the blue laser beam in the fast axis X is greater than the divergence angle of the red laser beam in the slow axis Y.

In this case, if the first surface 1051 of the collimating lens 1050 is a concave curved surface and the second surface 1052 of the collimating lens 1050 is a convex curved surface, the curvature radius of the concave curved surface of the collimating lens 1050 corresponding to the blue laser beam in the slow axis Y may be greater than the curvature radius of the concave curved surface of the collimating lens 1050 corresponding to the red laser beam in the slow axis Y. Moreover, the curvature radius of the concave curved surface of the collimating lens 1050 corresponding to the blue laser beam in the slow axis Y may be less than the curvature radius of the concave curved surface of the collimating lens 1050 corresponding to the red laser beam in the fast axis X.

If the first surface 1051 of the collimating lens 1050 of the collimating lens group 105 is a plane, and the second surface 1052 of the collimating lens 1050 of the collimating lens group 105 is a convex curved surface, the curvature radius of the convex curved surface of the collimating lens 1050 corresponding to the blue laser beam in the fast axis X may be greater than the curvature radius of the convex curved surface of the collimating lens 1050 corresponding to the red laser beam in the fast axis X. Moreover, the curvature radius of the convex curved surface of the collimating lens 1050 corresponding to the blue laser beam in the fast axis X may be less than the curvature radius of the convex curved surface of the collimating lens 1050 corresponding to the red laser beam in the slow axis Y. For different relationships between divergence angles of laser beams of other colors, it may be reasoned out according to the above description, and details will not be repeated herein.

In some embodiments of the present disclosure, by providing the collimating lenses 1050 corresponding to different wavelengths, it is possible to reduce length-to-width ratios of beam spots of the laser beams of different colors after passing through the collimating lens 1050, so as to reduce the difference between the divergence angles of the laser beams of different colors in the fast axis X and slow axis Y, and improve the overall collimating effect of the laser device 10 on the laser beams.

A person skilled in the art will understand that, the scope of the disclosure in the present disclosure is not limited to specific embodiments discussed above, and may modify and substitute some elements of the embodiments without departing from the spirits of this application. The scope of the present application is limited by the appended claims.

What is claimed is:

1. A laser device, comprising:

a base plate;

a plurality of light-emitting chips disposed on the base plate, the plurality of light-emitting chips being configured to emit laser beams, and the laser beams emitted by the plurality of light-emitting chips each having a first axis and a second axis;

a frame disposed on the base plate and surrounding the plurality of light-emitting chips; and a collimating lens group disposed on a side of the frame away from the base plate, and the collimating lens group including:

a plurality of collimating lenses corresponding to the plurality of light-emitting chips, at least one of the plurality of collimating lenses being configured to reduce a divergence angle of a laser beam of the laser beams incident on the collimating lens, so as to make a reduction of the divergence angle of the laser beam passing through the collimating lens in the first axis less than a reduction of the divergence angle of the laser beam passing through the collimating lens in the second axis, wherein at least one of the plurality of the collimating lens includes:

a first surface; and a second surface disposed opposite to the first surface and including a convex curved surface, the convex curved surface protruding in a direction away from the base plate, and the second surface being configured to reduce a divergence angle of the laser beam incident on the second surface, wherein the first surface is closer to the base plate than the second surface, the laser beam emitted by each of the plurality of light-emitting chips is incident on the first surface and exiting from the second surface; and the convex curved surface includes a cylindrical surface, and a straight generatrix of the cylindrical surface is parallel to the first axis, wherein the laser device further comprises:

a light-transmitting layer connected to the frame and located on a side of the plurality of light-emitting chips away from the base plate, the collimating lens group being located on a side of the light-transmitting layer away from the base plate, wherein the frame, the base plate and the light-transmitting layer is enclosed to be an enclosed accommodating space;

or, the laser device further comprises:

a cover plate located on a side of the frame away from the base plate; and a light-transmitting layer located on a side of the cover plate away from the base plate and fixedly connected to the cover plate; the collimating lens group is disposed on a side of the cover plate away from the frame and on a side of the light-transmitting layer away from the base plate, wherein the frame, the base plate, the cover plate and the light-transmitting layer enclose to be an enclosed accommodating space.

2. The laser device according to claim 1, wherein the first surface includes a concave curved surface, the concave curved surface is recessed in the direction away from the base plate, and the concave curved surface is configured to increase a divergence angle of the laser beam incident on the concave curved surface.

3. The laser device according to claim 2, wherein a curvature of the second surface in the first axis is less than or equal to a curvature of the second surface in the second axis, so as to make a reduction of the divergence angle of the laser beam incident on the second surface in the first axis less than or equal to a reduction of the divergence angle of the laser beam incident on the second surface in the second axis.

4. The laser device according to claim 3, wherein a curvature of the first surface in the first axis is greater than a curvature of the first surface in the second axis, so as to make an increase of the divergence angle of the laser beam incident on the first surface in the first axis greater than an increase of the divergence angle of the laser beam incident on the first surface in the second axis;

or, the concave curved surface includes a cylindrical surface, and a straight generatrix of the cylindrical surface is parallel to the second axis.

5. The laser device according to claim 2, wherein a curvature radius of the concave curved surface is greater than a curvature radius of the convex curved surface.

6. The laser device according to claim 1, wherein the first surface is a plane; and a curvature of the second surface in the first axis is less than a curvature of the second surface in the second axis, so as to make a reduction of the divergence angle of the laser beam incident on the second surface in the first axis less than a reduction of the divergence angle of the laser beam incident on the second surface in the second axis.

7. The laser device according to claim 1, wherein a curvature of the second surface in the first axis is less than or equal to a curvature of the second surface in the second axis, so as to make a reduction of the divergence angle of the laser beam incident on the second surface in the first axis less than or equal to a reduction of the divergence angle of the laser beam incident on the second surface in the second axis.

8. The laser device according to claim 1, wherein the plurality of light-emitting chips are configured to emit laser beams of at least two colors;

the collimating lenses corresponding to laser beams of different wavelengths have different curvatures.

9. The laser device according to claim 8, wherein the plurality of light-emitting chips include:

a first light-emitting chip configured to emit a first color laser beam; and a second light-emitting chip configured to emit a second color laser beam, a divergence angle of the first color laser beam being less than a divergence angle of the second color laser beam; wherein the collimating lens group is configured to make a reduction of a divergence angle of the first color laser beam passing through the collimating lens corresponding to the first light-emitting chip less than a reduction of a divergence angle of the second color laser beam passing through the collimating lens corresponding to the second light-emitting chip.

10. The laser device according to claim 1, wherein the plurality of light-emitting chips are arranged in a matrix of M rows and N columns, and M and N are integers greater than or equal to 1, and at least one of M or N is greater than 1.

11. The laser device according to claim 10, wherein curvatures of the collimating lenses in different rows or columns in the second axis are different from curvatures of the collimating lenses in different rows or columns in the first axis.

12. The laser device according to claim 10, wherein the first axis of the laser beam incident on the collimating lens group is parallel to a row direction of the plurality of light-emitting chips or a row direction of the collimating lens group;

the second axis of the laser beam incident on the collimating lens group is parallel to a column direction of the plurality of light-emitting chips or a column direction of the collimating lens group.

13. The laser device according to claim 12, wherein a distance between two adjacent rows of collimating lenses in the column direction of the collimating lens group is greater than a distance between two adjacent columns of collimating lenses in the row direction of the collimating lens group.

14. The laser device according to claim 12, wherein each column of two columns of collimating lenses on two sides of the collimating lens group in the row direction of the collimating lens group, widths of the two columns of collimating lenses along the row direction of the collimating lens group each are greater than widths of other rows of collimating lenses of the collimating lens group along the row direction of the collimating lens group.

* * * * *